US012765088B2

(12) United States Patent
Hai et al.

(10) Patent No.: US 12,765,088 B2
(45) Date of Patent: Oct. 13, 2026

(54) PATTERN RECOGNITION SUBSTRATE AND DISPLAY DEVICE

(71) Applicant: BOE Technology Group Co., Ltd., Beijing (CN)

(72) Inventors: Xiaoquan Hai, Beijing (CN); Xiaochuan Chen, Beijing (CN); Lei Wang, Beijing (CN); Yingzi Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 430 days.

(21) Appl. No.: 18/579,883

(22) PCT Filed: Jul. 1, 2022

(86) PCT No.: PCT/CN2022/103437

§ 371 (c)(1),
(2) Date: Jan. 17, 2024

(87) PCT Pub. No.: WO2023/000963

PCT Pub. Date: Jan. 26, 2023

(65) Prior Publication Data

US 2025/0015103 A1 Jan. 9, 2025

(30) Foreign Application Priority Data

Jul. 23, 2021 (CN) ........................ 202110836730.5

(51) Int. Cl.

*H10F 39/00* (2025.01)
*G06V 40/13* (2022.01)
*H10H 29/14* (2025.01)

(52) U.S. Cl.

CPC ..... *H10F 39/8027* (2025.01); *G06V 40/1318* (2022.01); *H10F 39/80373* (2025.01); *H10F 39/805* (2025.01); *H10H 29/142* (2025.01)

(58) Field of Classification Search

CPC ............... H10F 39/8027; H10F 39/805; H10F 39/80373; G06V 40/1318; H10H 29/142

See application file for complete search history.

(56) References Cited

U.S. PATENT DOCUMENTS

2021/0073506 A1* 3/2021 Huang ..................... G09G 3/32
2021/0233972 A1* 7/2021 Liu ........................ H10K 59/60
2021/0350100 A1* 11/2021 Park ....................... H10K 59/40

* cited by examiner

*Primary Examiner* — Afroza Chowdhury
(74) *Attorney, Agent, or Firm* — IPro, PLLC

(57) ABSTRACT

A pattern recognition substrate and a display device are disclosed, the pattern recognition substrate includes: a base substrate; a photosensitive device arranged on the base substrate and including a first electrode, a photoelectric conversion layer and a second electrode that are stacked, where the photoelectric conversion layer includes an I-type semiconductor layer with a thickness enough to convert a part of fingerprint-reflected light to an electrical signal, the first electrode includes a light-transmitting region transmitting the fingerprint-reflected light which is converted by the photoelectric conversion layer; and a light absorbing layer arranged between the base substrate and a layer where the photosensitive device is located to absorb the fingerprint-reflected light not converted by the photoelectric conversion layer.

17 Claims, 16 Drawing Sheets

PATTERN RECOGNITION SUBSTRATE AND DISPLAY DEVICE

CROSS-REFERENCE TO RELATED APPLICATIONS

This application is a National Stage of International Application No. PCT/CN2022/103437, filed on Jul. 1, 2022, which claims priority to Chinese Patent Application 202110836730.5, filed with the China National Intellectual Property Administration on Jul. 23, 2021 and entitled "Pattern Recognition Substrate and Display Device", which is hereby incorporated by reference in its entirety.

TECHNICAL FIELD

The disclosure relates to the field of display technology, and in particular to a pattern recognition substrate and a display device.

BACKGROUND

With the rapid development of the information industry, the biometric recognition technology has been increasingly widely used. In particular, different users have different fingerprints, facilitating confirmation of user identity, so the fingerprint recognition technology has been widely used in mobile terminals, smart homes and other fields, to provide security for user information.

The optical fingerprint recognition is one of means to achieve fingerprint recognition. The principle of the optical fingerprint recognition is as follows: when a finger is placed above a display product, the light emitted from the light source included in the display product strikes valleys and ridges of the finger, is reflected by the valleys and ridges of the finger, and then enters a photosensitive device included in the display product. Since the light reflected at the valleys and ridges have different intensities, the photosensitive device generates different electrical signals based on the difference between the above intensities of the reflected light, to realize the fingerprint recognition.

SUMMARY

Solutions of a pattern recognition substrate and a display device provided in embodiments of the disclosure are as follows.

In one aspect, an embodiment of the disclosure provides a pattern recognition substrate, including:

- a base substrate;
- a photosensitive device located on the base substrate, the photosensitive device including a first electrode, a photoelectric conversion layer and a second electrode that are stacked, where the photoelectric conversion layer includes an I-type semiconductor layer with a thickness enough to convert a part of fingerprint-reflected light to an electrical signal, and the first electrode includes a light-transmitting region transmitting fingerprint-reflected light that is not converted by the photoelectric conversion layer; and
- a light-absorbing layer located between the base substrate and a layer where the photosensitive device is located to absorb the fingerprint-reflected light that is not converted by the photoelectric conversion layer.

Optionally, in the above pattern recognition substrate according to an embodiment of the disclosure, the first electrode is a metal electrode, the first electrode includes a plurality of openings arranged in an array, and the plurality of openings is the light-transmitting region.

Optionally, in the above pattern recognition substrate according to an embodiment of the disclosure, the openings are approximately circular.

Optionally, in the above pattern recognition substrate according to an embodiment of the disclosure, an aperture ratio A of the first electrode satisfies a following relationship:

$$A=\pi*d^2/(4q^2);$$

where d is a diameter of a circle, and q is a distance between centers of two adjacent circles.

Optionally, in the above pattern recognition substrate according to an embodiment of the disclosure, the openings are approximately square.

Optionally, in the above pattern recognition substrate according to an embodiment of the disclosure, an aperture ratio A of the first electrode satisfies a following relationship:

$$A=d^2/q^2;$$

where d is a side length of a square, and q is a distance between centers of two adjacent squares.

Optionally, in the above pattern recognition substrate according to an embodiment of the disclosure, 2 μm≤d≤6 μm, 5 μm≤q≤20 μm, and 0.1≤A≤0.6.

Optionally, in the above pattern recognition substrate according to an embodiment of the disclosure, a center of each of the openings is located at a vertex of a polygon.

Optionally, in the above pattern recognition substrate according to an embodiment of the disclosure, the polygon is a rectangle or a hexagon.

Optionally, in the above pattern recognition substrate according to an embodiment of the disclosure, the first electrode is a transparent electrode, and an entire region of the first electrode is the light-transmitting region.

Optionally, the above pattern recognition substrate according to an embodiment of the disclosure further includes a transistor located between the base substrate and the light-absorbing layer, where the transistor is electrically connected to the first electrode, and the transistor is a double-gate transistor.

Optionally, in the above pattern recognition substrate according to an embodiment of the disclosure, an orthographic projection of the transistor on the base substrate does not overlap with an orthographic projection of the photosensitive device on the base substrate.

Optionally, the above pattern recognition substrate according to an embodiment of the disclosure further includes a planarization layer located between a layer where the transistor is located and a layer where the first electrode is located, where the planarization layer is multiplexed as the light-absorbing layer.

Optionally, in the above pattern recognition substrate according to an embodiment of the disclosure, a material of the planarization layer is black resin.

Optionally, in the above pattern recognition substrate according to an embodiment of the disclosure, a thickness of the I-type semiconductor layer in a direction perpendicular to the base substrate is less than 9000 Å.

Optionally, the above pattern recognition substrate according to an embodiment of the disclosure further includes: a light-emitting device located on a side of the layer where the photosensitive device is located away from the base substrate;

where an orthographic projection of the light-emitting device on the base substrate does not overlap with an orthographic projection of the photosensitive device on the base substrate.

In another aspect, an embodiment of the disclosure further provides a display device, including the above pattern recognition substrate according to an embodiment of the disclosure.

DETAILED DESCRIPTION

In order to make purposes, technical solutions and advantages of the disclosure clearer, the technical solutions of embodiments of the disclosure will be described clearly and completely below in combination with accompanying drawings of embodiments of the disclosure. It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Unless otherwise defined, the technical or scientific terms used here shall have the general meaning understood by those ordinary skilled in the art to which the disclosure belongs. The "first", "second" and similar words used in the specification and claims of the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The words such as "inner", "outer", "up", "down" are only used to represent the relative position relationship. When the absolute position of a described object changes, the relative position relationship may also change accordingly.

Figure 1:
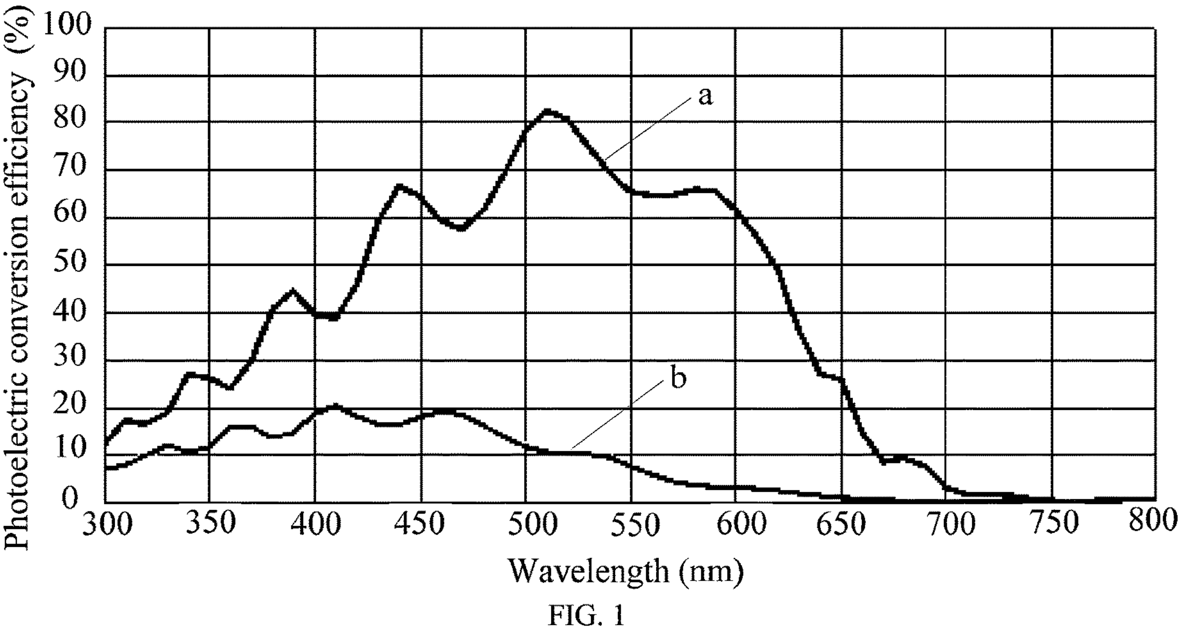
FIG. 1 shows curves of photoelectric conversion efficiency before and after an I-type semiconductor layer is thinned.

During the fingerprint recognition process, in order to reduce interference of ambient light, a layer of light filter film is generally added to a light incident side of a photosensitive device to filter out the ambient light after 600 nm, thus increasing the cost of the mask. Inventors found through research that, as shown in FIG. 1 and the following table, when an I-type semiconductor layer (i.e., I layer, also called intrinsic semiconductor layer) included in a photoelectric conversion layer (PIN) of a photosensitive device is thinned (where a represents a normal thickness 9000 Å of the I layer, and b represents a thinned thickness 500 Å of the I layer), photoelectric conversion efficiency (EQE) of the I layer can be reduced and will be cut off in a long wavelength band, so there is no need to set a light filter film separately.

| | Characteristics of photosensitive device | | | | | Cover |
|---|---|---|---|---|---|---|
| | PIN area (μm$^2$) | Full well capacity (fc) | EQE | System Integration time (ms) | Transmittance of light filter film | intensity from all angles (lx) |
| Conventional fingerprint recognition device with light filter film | 500 | 250 | 1 | 25 | 0.01 | 10 W |
| Fingerprint recognition device with I layer thinned | 500 | 2100 | 0.4 | 7-8 | — | 10 W |

However, when the I layer is thinned, unabsorbed light reflected by the finger may be reflected by a lower electrode (SD2) of the photosensitive device back to the finger touch position above the photosensitive device, and may be reflected again by the finger. Multiple reflections may interfere with the performance of the fingerprint recognition.

In order to alleviate the above technical problem in related art, an embodiment of the disclosure provides a an pattern recognition substrate, as shown in FIGS. 2 to 5, including:

a base substrate 101;

a photosensitive device 102 located on the base substrate 101, the photosensitive device including a first electrode 1021, a photoelectric conversion layer 1022 and a second electrode 1023 that are stacked, where the photoelectric conversion layer 1022 includes an I-type semiconductor layer with a thickness enough to convert a part of fingerprint-reflected light to an electrical signal, and the first electrode 1021 includes a light-transmitting region L transmitting fingerprint-reflected light that is not converted by the photoelectric conversion layer 1022; and a light-absorbing layer 103 located between the base substrate 101 and a layer where the photosensitive device 102 is located to absorb the fingerprint-reflected light that is not converted by the photoelectric conversion layer 1022.

In the above pattern recognition substrate according to an embodiment of the disclosure, the I-type semiconductor layer cannot completely absorb the fingerprint-reflected light when being thinned (that is, less than the conventional thickness). By setting the first electrode 1021 under the I-type semiconductor layer to include the light-transmitting region L, the fingerprint-reflected light that is not absorbed and converted by the I-type semiconductor layer passes through the light-transmitting region L and irradiates to the light-absorbing layer 103 and is then absorbed, thereby avoiding the fingerprint-reflected light that is not absorbed and converted by the I-type semiconductor layer from being reflected multiple times between the first electrode 1021 and the finger, and thus improving the accuracy of fingerprint recognition.

Figure 6:
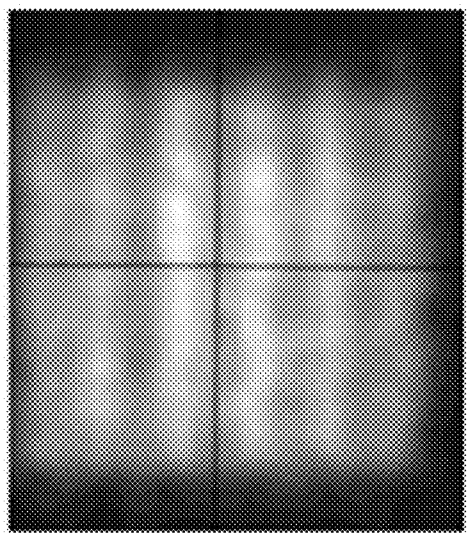
FIG. 6 is a fingerprint image of a first pattern recognition substrate in related art.
Figure 7:
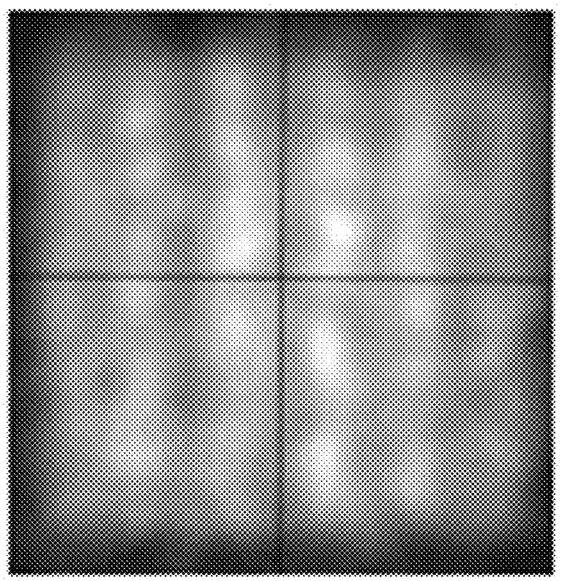
FIG. 7 is a fingerprint image of a second pattern recognition substrate in related art.
Figure 8:
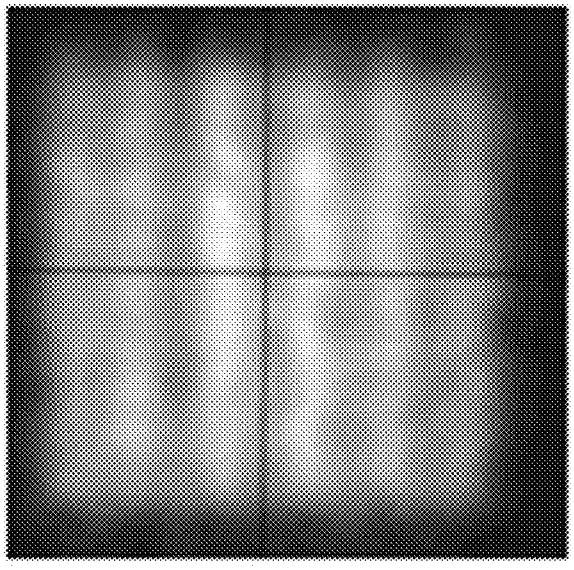
FIG. 8 is a fingerprint image of a pattern recognition substrate shown in FIG. 5.

In some embodiments, the thickness of the I-type semiconductor layer according to the disclosure may be less than 9000 Å, for example, may be 500 Å. Furthermore, a set of data is provided for the pattern recognition substrate of the disclosure and two pattern recognition substrates as contrasts. In the pattern recognition substrate of the disclosure, the thickness of the I-type semiconductor layer is 500 Å, the first electrode 1021 includes the light-transmitting region L, and there is the light-absorbing layer 103 below the first electrode 1021; in the first pattern recognition substrate as a contrast, the thickness of the I-type semiconductor layer is 9000 Å (that can completely convert the fingerprint-reflected light), and the first electrode 1021 does not include the light-transmitting region L; and, in the second pattern recognition substrate as a contrast, the thickness of the I-type semiconductor layer is 500 Å, and the first electrode 1021 does not include the light-transmitting region L. Here, the fingerprint image in the first pattern recognition substrate is shown in FIG. 6, and the valley-ridge difference and contrast ratio of the fingerprint are 1.5 and 0.069 respectively. When the I-type semiconductor layer is thinned to become the structure of the first pattern recognition substrate, the fingerprint image is shown in FIG. 7. The valley-ridge difference of the fingerprint quickly decreases from 1.5 to 0.6, and the contrast ratio also decreases from 0.069 to 0.021, indicating that the valley and ridge signals of the fingerprint are interfered with after the I-type semiconductor layer is thinned. The fingerprint image in the pattern recognition substrate of the disclosure is shown in FIG. 8, the valley-ridge difference of the fingerprint is 2.5, and the contrast ratio is 0.084. The fingerprint recognition performance basically reaches the fingerprint recognition level of the first pattern recognition substrate including the I-type semiconductor layer with conventional thickness in the related art, indicating that the feasibility of the disclosure is better.

Figure 5:
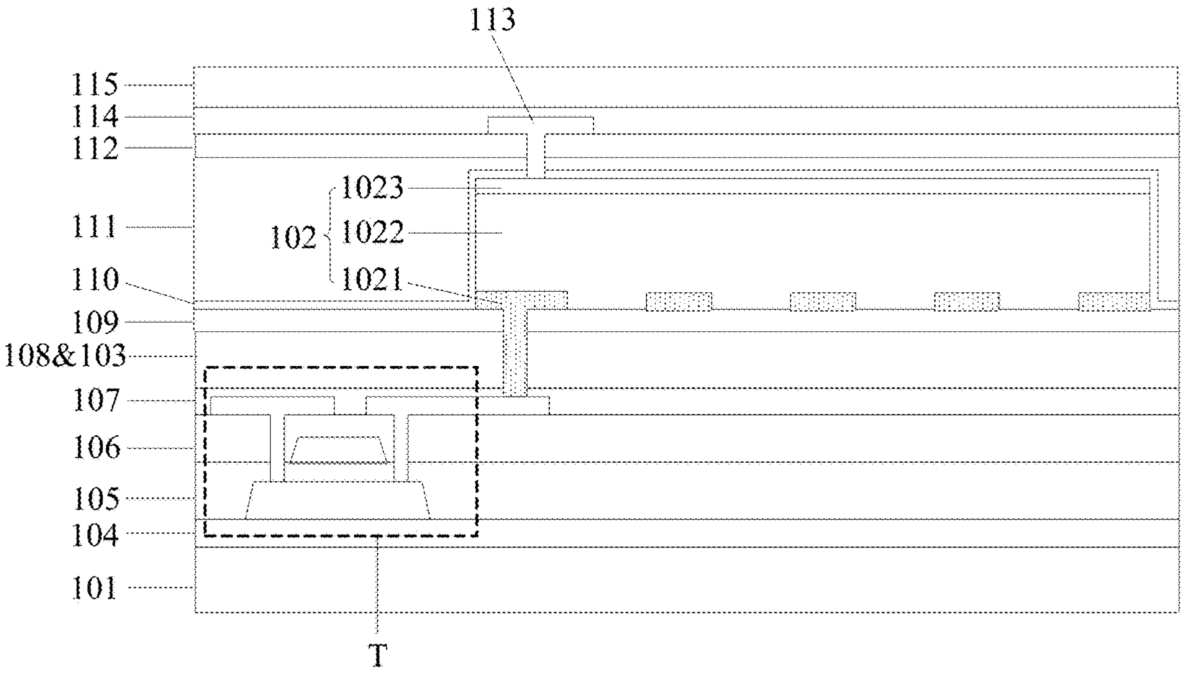
FIG. 5 is a schematic diagram of a cross-sectional structure along line I-II in FIGS. 2-4.

Furthermore, it is worth noting that, as shown in FIG. 5, the photoelectric conversion layer 1022 may further include a P-type semiconductor layer and an N-type semiconductor layer stacked with the I-type semiconductor layer. In some embodiments, the N-type semiconductor layer may be deposited firstly, then the I-type semiconductor layer may be deposited, and finally the P-type semiconductor layer may be deposited; or, the P-type semiconductor layer may be deposited firstly, then the I-type semiconductor layer may be deposited, and finally the N-type semiconductor layer may be deposited. When the conventional thickness of the I-type semiconductor layer is 9000 Å, it takes about 1600 s to deposit a piece of glass (370*470), greatly taking up mass production hours. Thinning the I-type semiconductor layer can greatly shorten mass production hours and improve the production efficiency.

Figure 3:
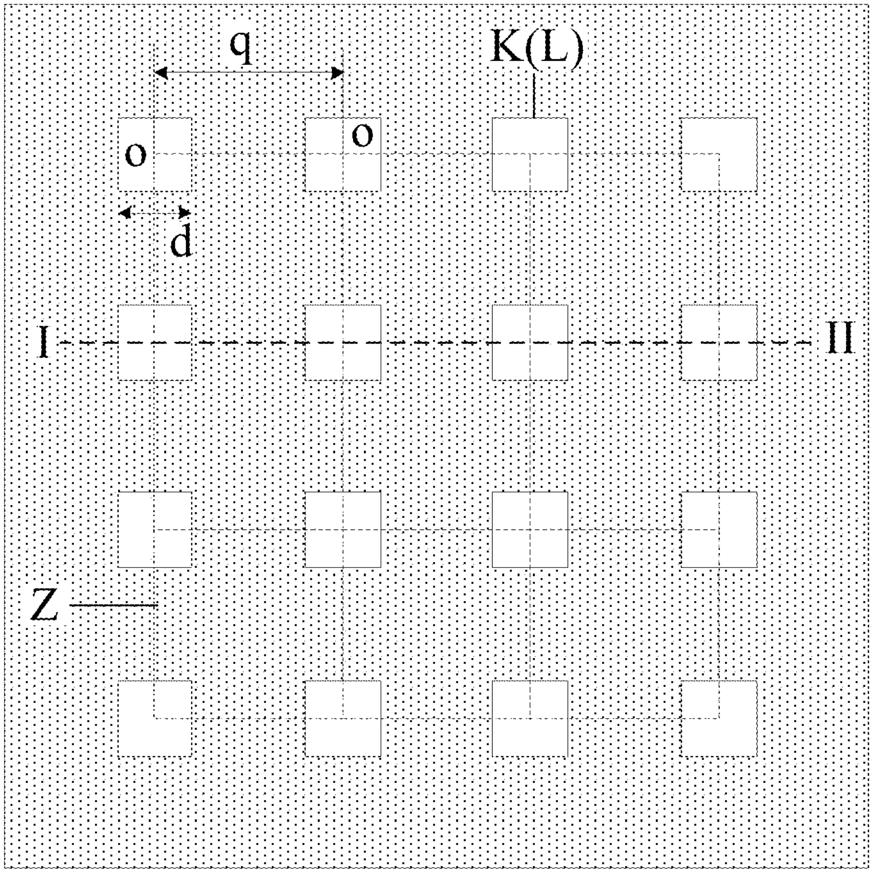
FIG. 3 is a schematic structural diagram of a first electrode according to an embodiment of the disclosure.
Figure 4:
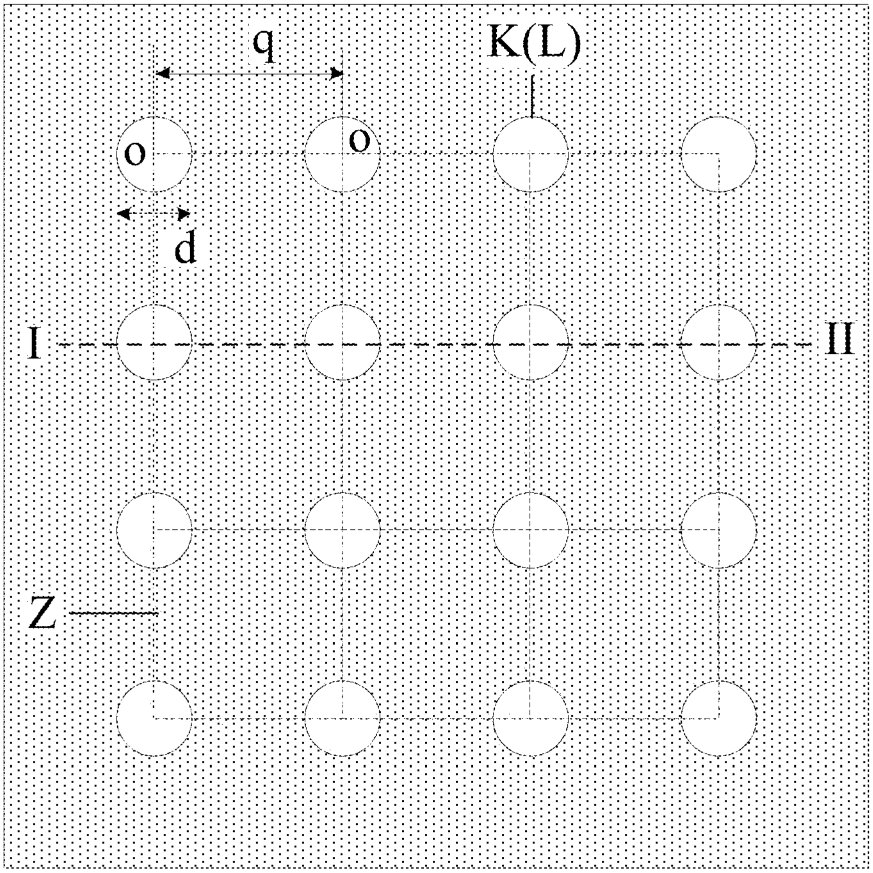
FIG. 4 is another structural schematic diagram of a first electrode according to an embodiment of the disclosure.

In some embodiments, in the above-mentioned pattern recognition substrate according to an embodiment of the disclosure, as shown in FIGS. 3 to 5, the first electrode 1021 may be a metal electrode. In this case, a plurality of openings K arranged in an array may be provided for the first electrode 1021, and then the plurality of openings K is the light-transmitting region L.

In some embodiments, as shown in FIGS. 3 and 4, the openings K are approximately circular or square. Of course, the shape of the openings K may also be other regular or irregular shape during specific implementation, and is not limited here. It should be noted that, in embodiments provided by the disclosure, due to the limitation of process conditions or the influence of other factors such as measurement, the above-mentioned "approximately" may be completely equivalent, or there may be some deviations, so the "approximately" relationship between the above features belongs to the protection scope of the disclosure as long as the relationship satisfies the tolerance of error (for example, the fluctuation of 10% up and down).

When the openings K are circular, an opening ratio A of the first electrode 1021 satisfies a following relationship:

$$A = \pi * d^2/(4q^2) \tag{1}$$

Here, d is a diameter of a circle, and q is a distance between centers o of two adjacent circles.

When the openings K are square, an opening ratio A of the first electrode 1021 satisfies a following relationship:

$$A = d^2/q^2 \tag{2}$$

Here, d is a side length of a square, and q is a distance between centers o of two adjacent squares.

In some embodiments, in order to effectively reduce the reflection of the fingerprint-reflected light that is not absorbed by the I-type semiconductor layer by the first electrode 102, the aperture ratio and the arrangement of openings need to be reasonably set. Optionally, a value range of the above d is 2 μm≤d≤6 μm, a value range of the above q is 5 μm≤q≤20 μm, and a value range of the aperture ratio A is 0.1≤A≤0.6.

Figure 9:
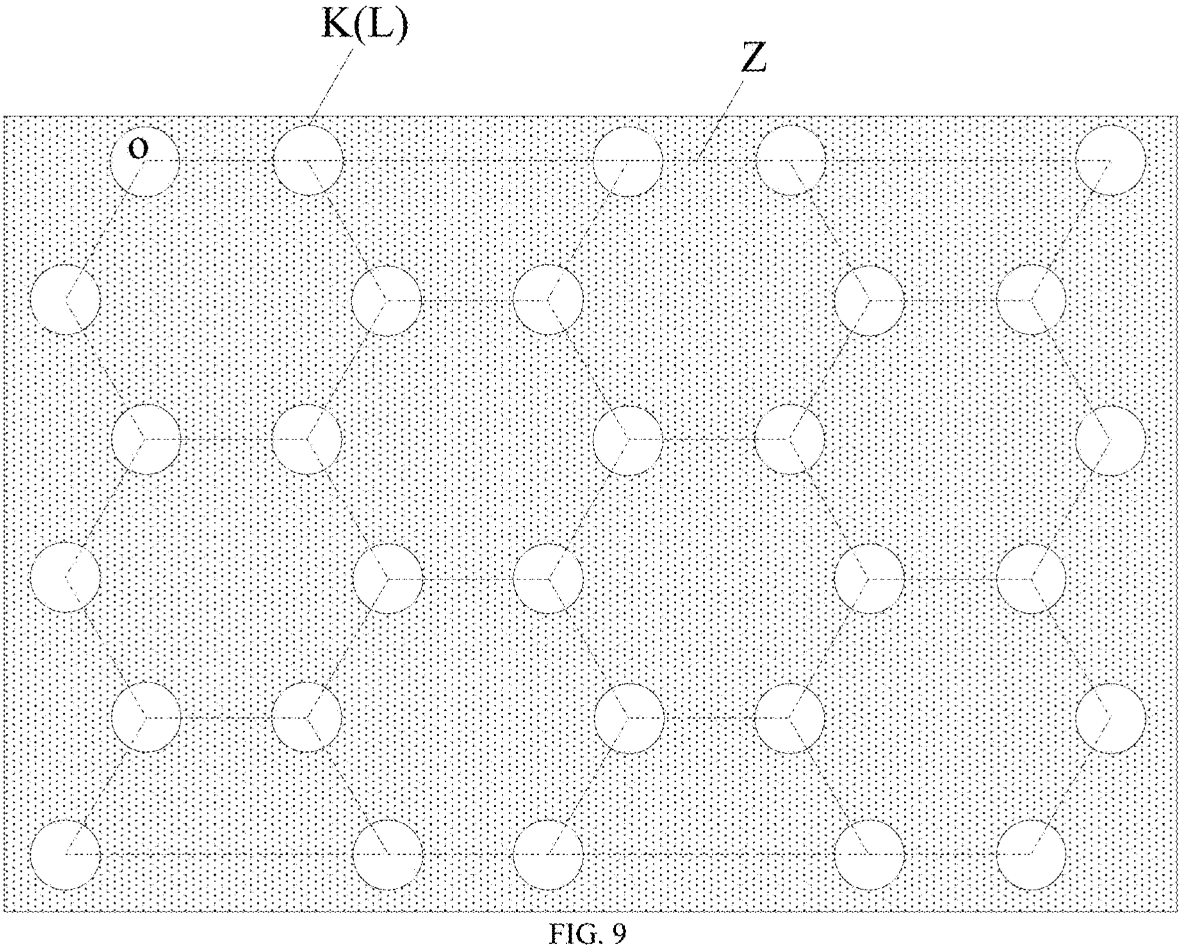
FIG. 9 is another structural schematic diagram of a first electrode according to an embodiment of the disclosure.

In some embodiments, in the above-mentioned pattern recognition substrate according to an embodiment of the disclosure, in order to transmit light evenly, as shown in FIGS. 3, 4 and 9, the center o of each opening K may be located at a vertex of a polygon Z. Optionally, as shown in FIGS. 3 and 4, the polygon Z is a rectangle; or, as shown in FIG. 9, the polygon Z is a hexagon.

Figure 10:
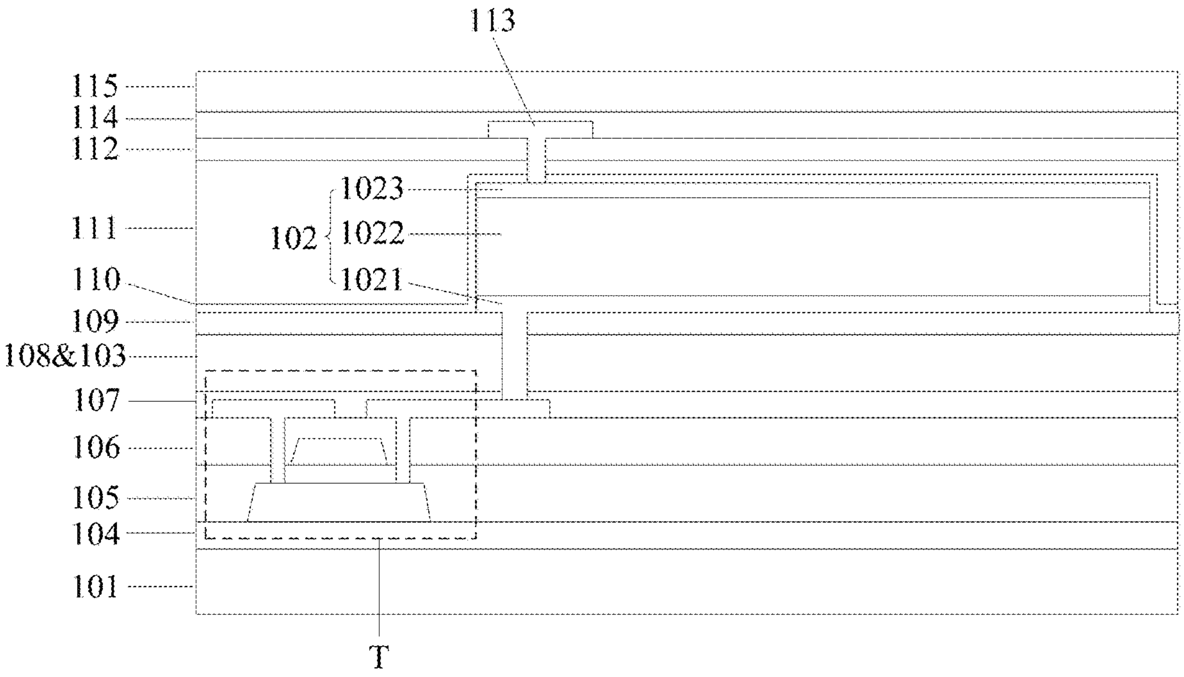
FIG. 10 is a schematic diagram of another cross-sectional structure along line I-II in FIGS. 2-4.

In some embodiments, in the above-mentioned pattern recognition substrate according to an embodiment of the disclosure, as shown in FIG. 10, the first electrode 1021 may be a transparent electrode, and an entire region of the first electrode 1021 may be the light-transmitting region L, to transmit the fingerprint-reflected light that is not absorbed by the I-type semiconductor layer to the greatest extent.

In some embodiments, the above pattern recognition substrate according to an embodiment of the disclosure, as shown in FIGS. 5, 10 to 12, may further include a transistor T located between the base substrate 101 and the light-absorbing layer 103, where the transistor T is electrically connected to the first electrode 1021; and in order to increase gate control capability, the transistor T may be set as a double-gate transistor, that is, the transistor T includes two gates. In addition, as can be seen from FIG. 13, when the transistor T adopts a double-gate structure, the noise is smaller than the noise of a single-gate structure, to facilitate improving stability of the transistor T.

In some embodiments, in the above-mentioned pattern recognition substrate according to an embodiment of the disclosure, as shown in FIGS. 5, 10 to 12, an orthographic projection of the transistor T on the base substrate 101 does not overlap with an orthographic projection of the photosensitive device 102 on the base substrate 101, to avoid the parasitic capacitance therebetween as much as possible, and reduce the adverse impact of the first electrode 1021 on the transistor T.

In some embodiments, the above-mentioned pattern recognition module according to an embodiment of the disclosure, as shown in FIGS. 5 and 10, may further include: a buffer layer (buffer) 104, a gate insulating layer (GI) 105, an interlayer dielectric layer (ILD) 106, a first insulating layer (PVX1) 107, a planarization layer (PLN) 108, a second insulating layer (PVX2) 109, a protective layer (Cover) 110, a resin layer (RESIN) 111, a third insulation layer (PVX3) 112, a bias metal layer 113, a fourth insulating layer (PVX4) 114 and a shielding layer (ITO) 115.

Figure 11:
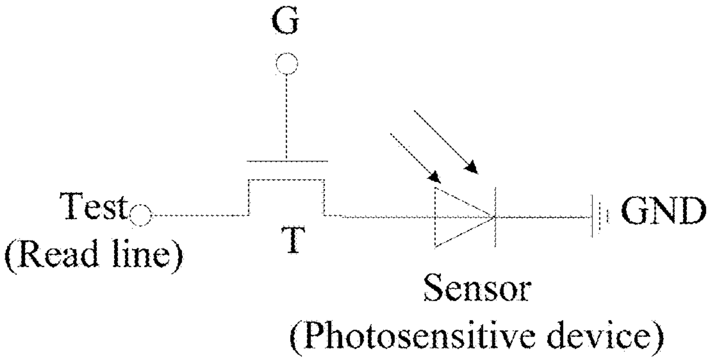
FIG. 11 is a schematic diagram of a transistor arranged in one pixel region.
Figure 12:
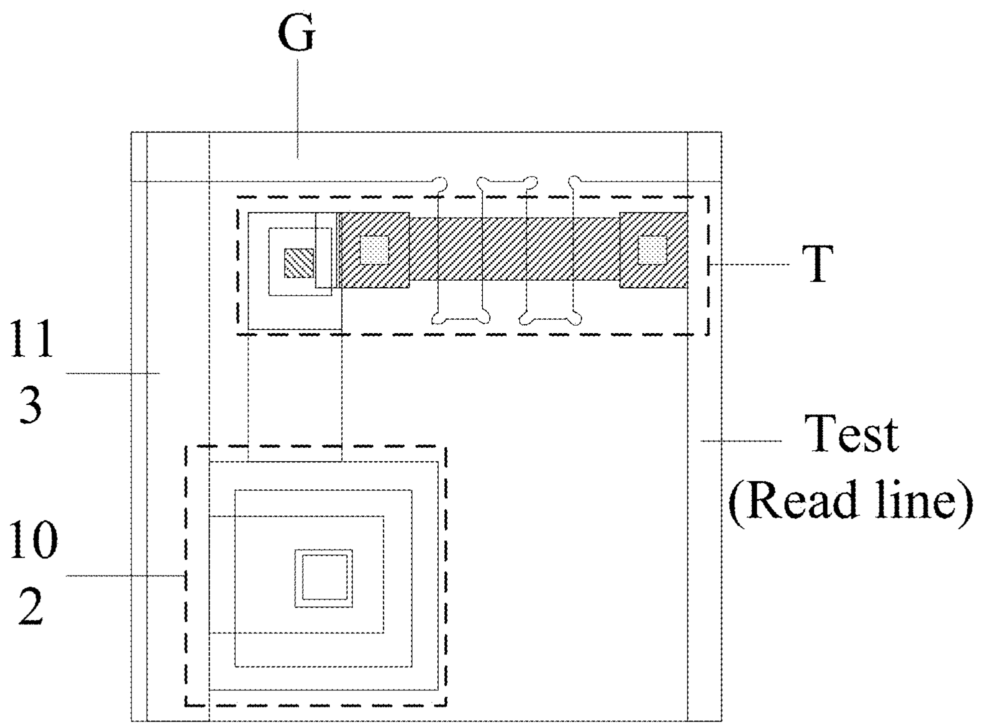
FIG. 12 is a schematic diagram of a stacked structure of a pixel region in a pattern recognition substrate shown in FIG. 2.
Figure 13:
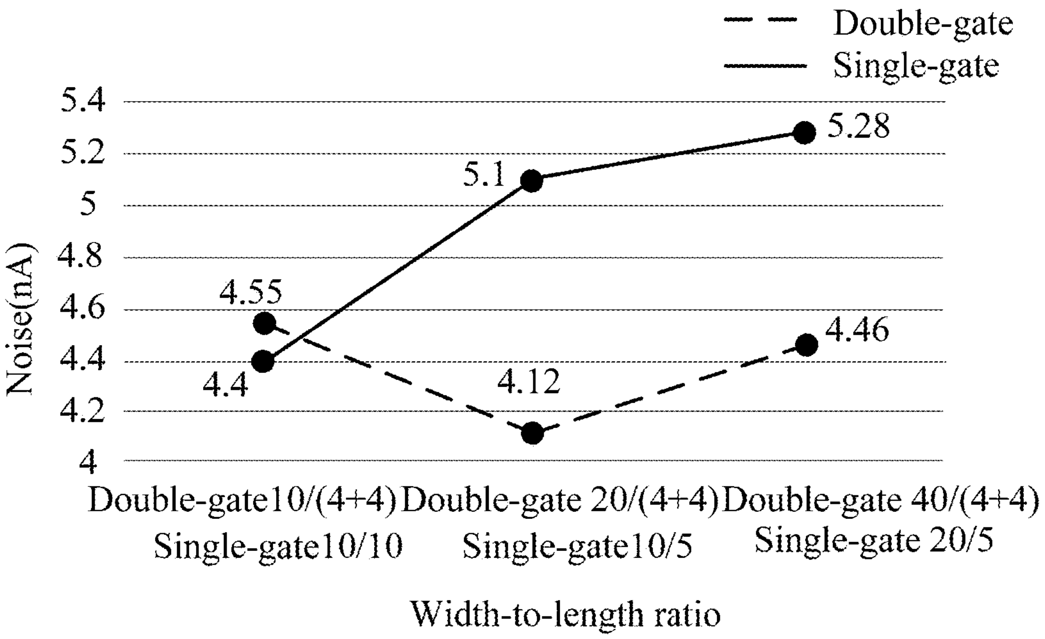
FIG. 13 shows a relationship curve between noise and width-to-length ratio of a transistor according to an embodiment of the disclosure.

In some embodiments, the region where one photosensitive device 102 is located is a pixel region. Optionally, one transistor T is arranged in one pixel region (as shown in FIG. 11), so that the pattern recognition substrate performs fingerprint recognition in the passive mode (PPS). FIG. 12 shows a layout design of respective film layers in one pixel region. FIGS. 14 to 24 are single film layer diagrams of the respective film layers shown in FIG. 12.

Figure 14:
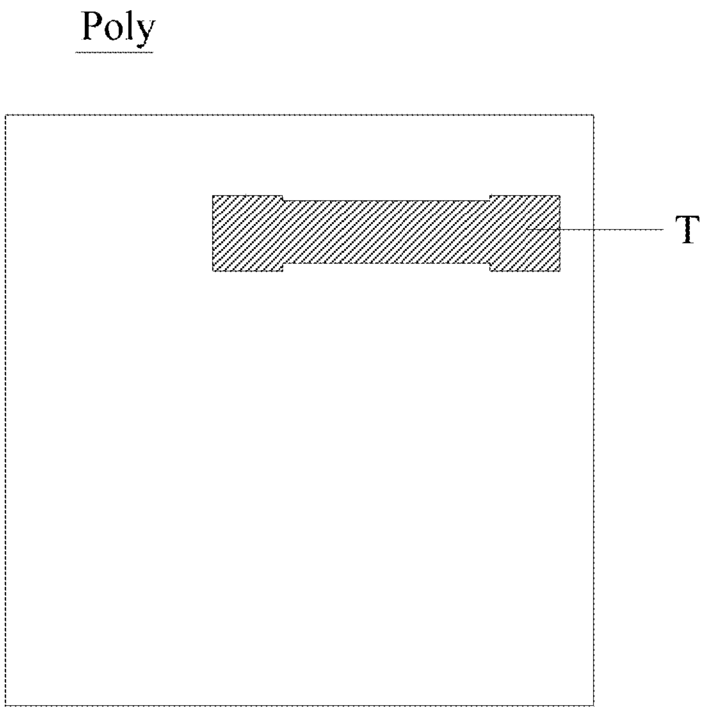
FIG. 14 is a schematic structural diagram of an active layer in FIG. 12.

FIG. 14 shows a graphic of an active layer Poly in one pixel region, including the active layer of the transistor T.

Figure 15:
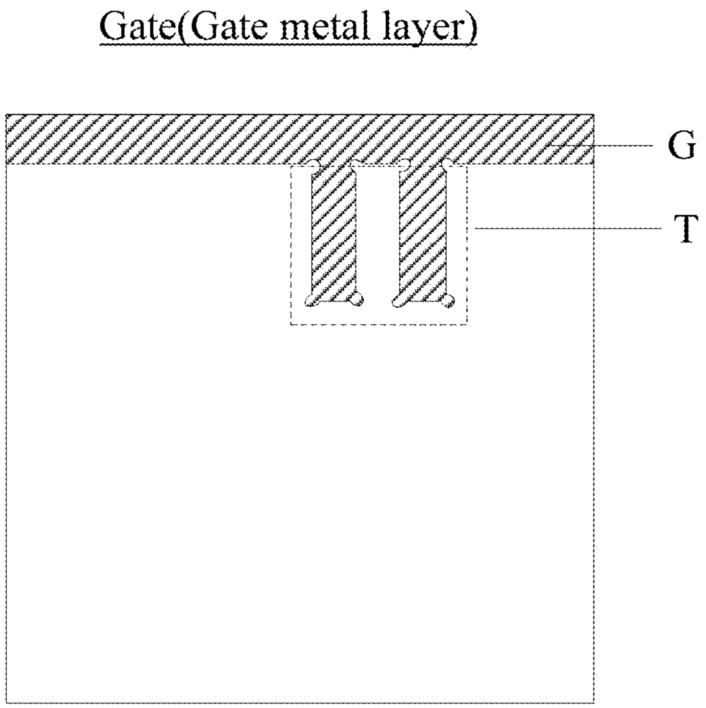
FIG. 15 is a schematic structural diagram of a gate metal layer in FIG. 12.

FIG. 15 shows a graphic of a gate metal layer (Gate) in one pixel region, including gates of the transistor T and a scan line G integrally provided with the gates of the transistor T. As can be seen from FIG. 15, the transistor T includes two gates and is a double-gate transistor.

Figure 16:
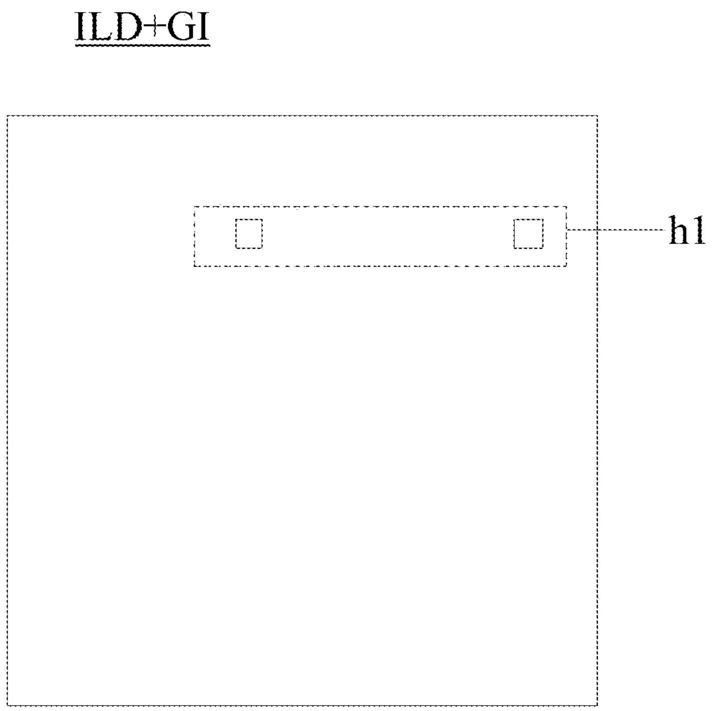
FIG. 16 is a schematic structural diagram of a gate insulating layer an interlayer dielectric layer in FIG. 12.

FIG. 16 shows a graphic of a gate insulating layer (GI) 105 and an interlayer dielectric layer (ILD) 106 in one pixel region, including through holes h1 for connecting the active layer with the source and drain of the transistor T.

Figure 17:
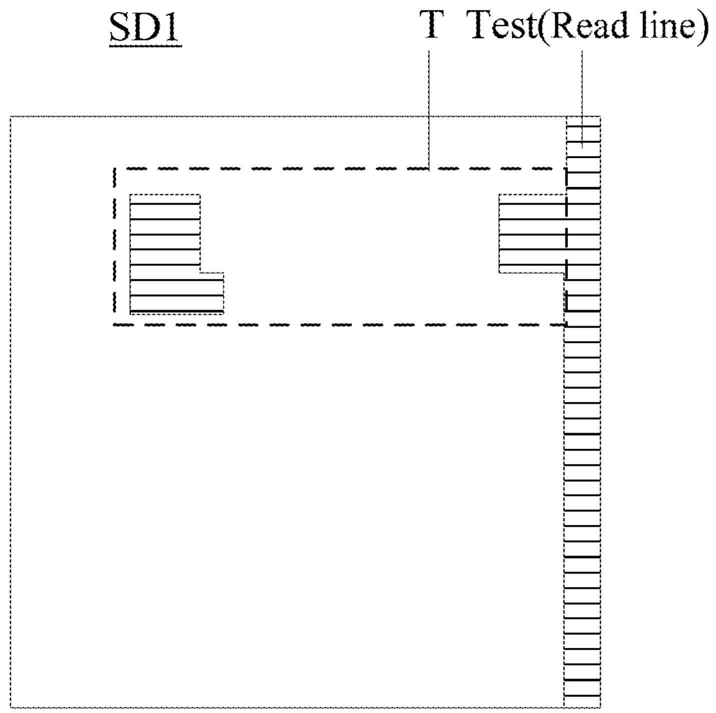
FIG. 17 is a schematic structural diagram of a source-drain metal layer in FIG. 12.

FIG. 17 shows a graphic of a source-drain metal layer SD1 in one pixel region, including the source and drain of the transistor T, and a read line (Test) integrally provided with the source and drain of the transistor T.

Figure 18:
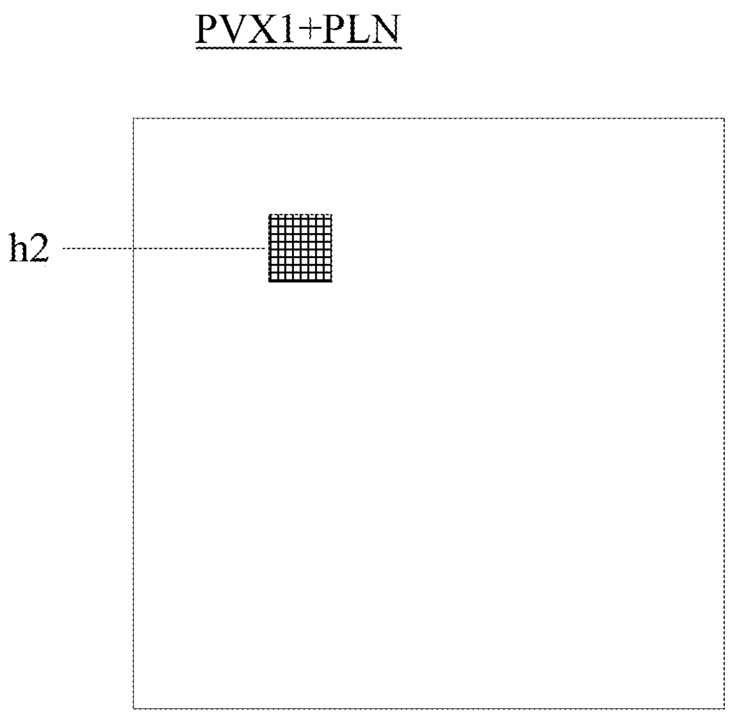
FIG. 18 is a schematic structural diagram of a first insulating layer and a planarization layer in FIG. 12.

FIG. 18 shows a graphic of a first insulating layer (PVX1) 107 and a planarization layer (PLN) 108 in one pixel region, including a through hole h2 for connecting the source/drain of the transistor T with the first electrode 1021 of the photosensitive device 102.

Figure 19:
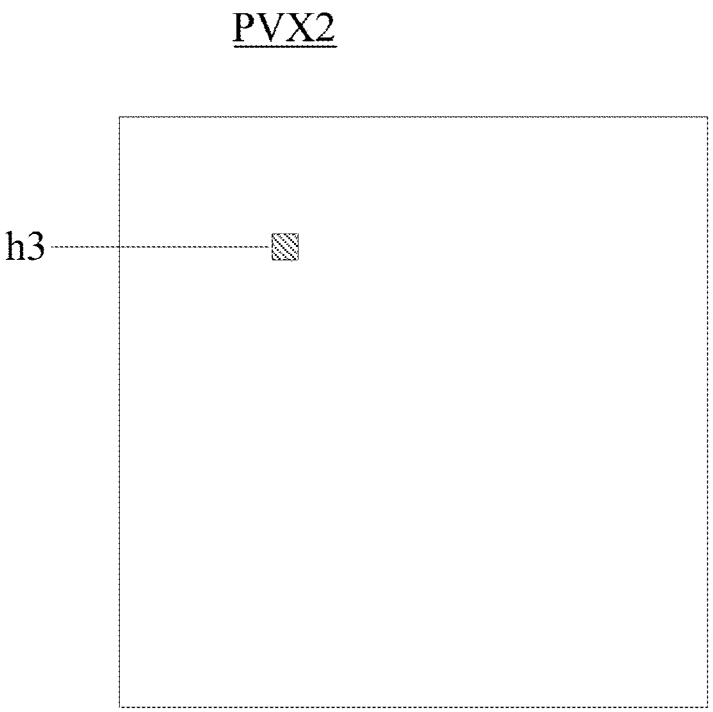
FIG. 19 is a schematic structural diagram of a second insulating layer in FIG. 12.

FIG. 19 shows a graphic of a second insulating layer (PVX2) 109 in one pixel region, including a through hole h3 for connecting the source/drain of the transistor T with the first electrode 1021 of the photosensitive device 102. Also, for the convenience of the electrical connection of the subsequently fabricated first electrode 1021 with the source/drain of the transistor T through h3 and h2, a diameter of the through hole h2 may be set to be larger than a diameter of the through hole h3.

Figure 20:
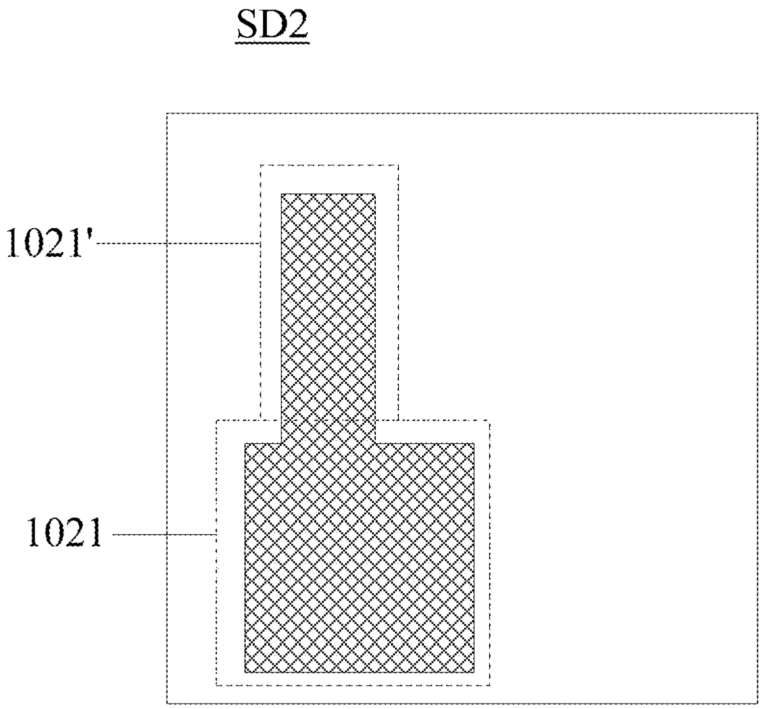
FIG. 20 is a schematic structural diagram of a layer where a first electrode is located in FIG. 12.

FIG. 20 shows a graphic of a first electrode 1021 (also called SD2) in one pixel region, including a first electrode 1021 of a photosensitive device S, and an extension electrode 1021' integrally provided with the first electrode 1021, where orthographic projections of the extension electrode 1021' and the source/drain of the transistor T overlap with each other, to implement the electrical connection of the first electrode 1021 of the photosensitive device S with the source/drain of the transistor T through the extension electrode 1021'.

Figure 21:
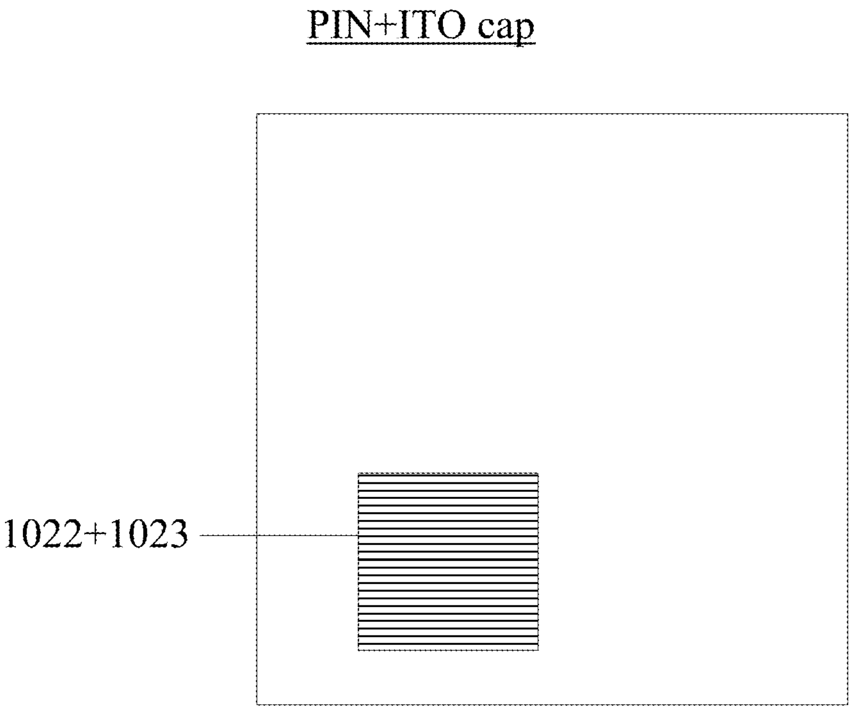
FIG. 21 is a schematic structural diagram of layers where a photoelectric conversion layer and a second electrode are located in FIG. 12.

FIG. 21 shows a graphic of a photoelectric conversion layer 1022 (also called PIN) and a second electrode 1023 (also called ITO cap) in one pixel region, including the photoelectric conversion layer 1022 and the second electrode 1023 of the photosensitive device 102, where the photoelectric conversion layer 1022 and the second electrode 1023 are located in the region where the first electrode 1021 is located.

Figure 22:
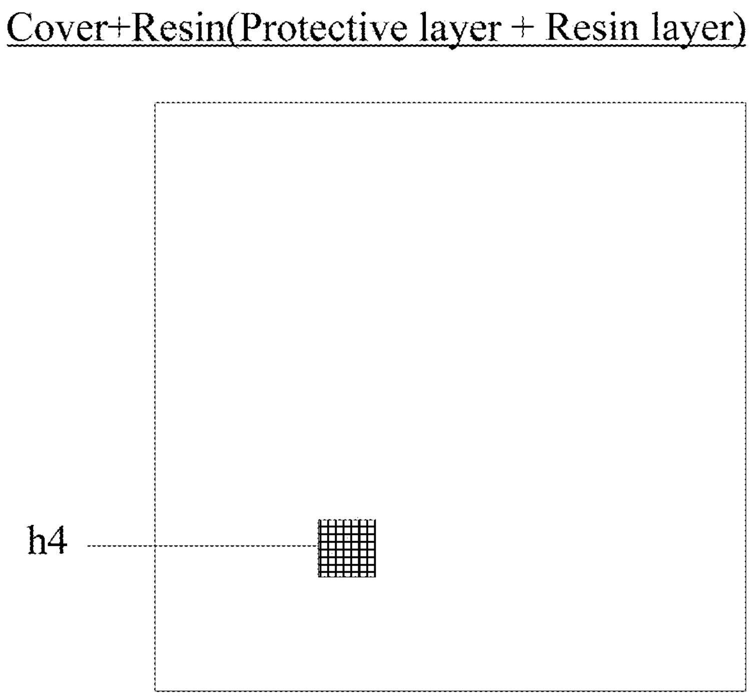
FIG. 22 is a schematic structural diagram of a protective layer and a resin layer in FIG. 12.

FIG. 22 shows a graphic of a protective layer (Cover) 110 and a resin layer (Resin) 111 in one pixel region, including a through hole h4 for connecting the second electrode 1023 of the photosensitive device 102 with the bias metal layer 113 (also called TM).

Figure 23:
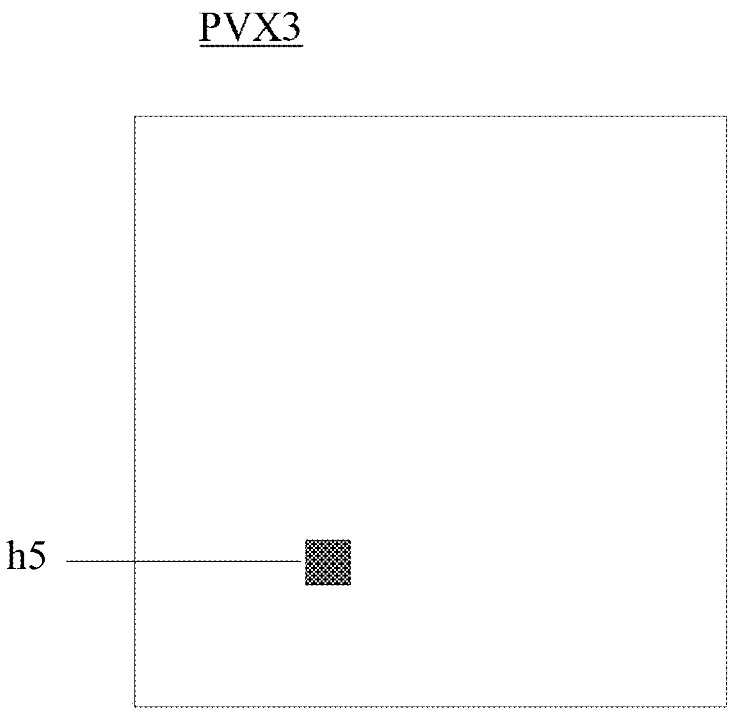
FIG. 23 is a schematic structural diagram of a third insulating layer in FIG. 12.

FIG. 23 shows a graphic of a third insulating layer (PVX3) 112 in one pixel region, including a through hole h5 for connecting the second electrode 1023 of the photosensitive device 102 with the bias metal layer 113 (also called TM), where a diameter of the through hole h5 is smaller than a diameter of the through hole h4.

Figure 24:
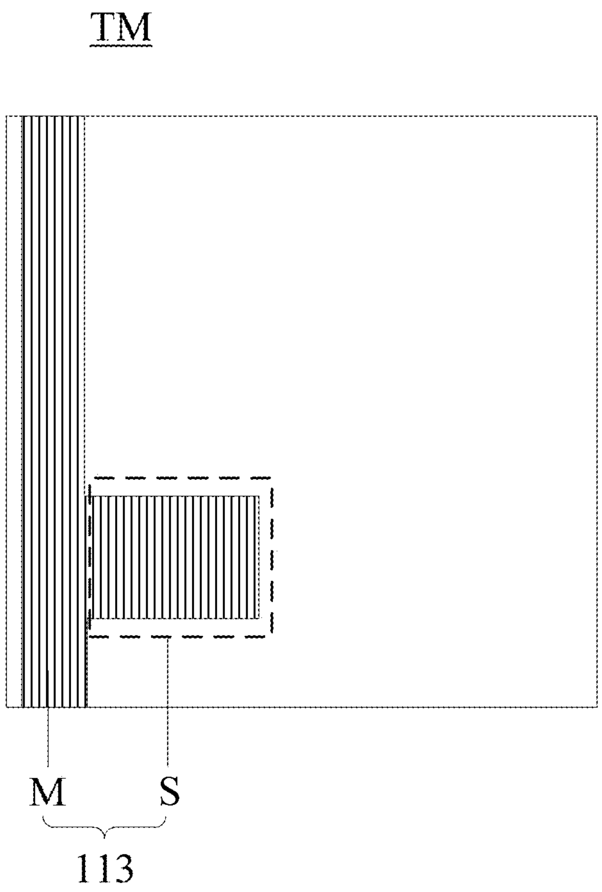
FIG. 24 is a schematic structural diagram of a bias metal layer in FIG. 12.

FIG. 24 shows a graphic of a bias metal layer 113 in one pixel region, including a main body M extending in a column direction, and a plurality of protruding portions S on the same side of the main body, where the protruding portions S are electrically connected to the second electrode 1023 of the photosensitive device 102, and the protruding portions S partially overlap with the second electrode 1023, so that the fingerprint-reflected light is irradiated onto the photoelectric conversion layer 1022 through the second electrode 1023 that does not overlap with the protruding portions S.

Figure 2:
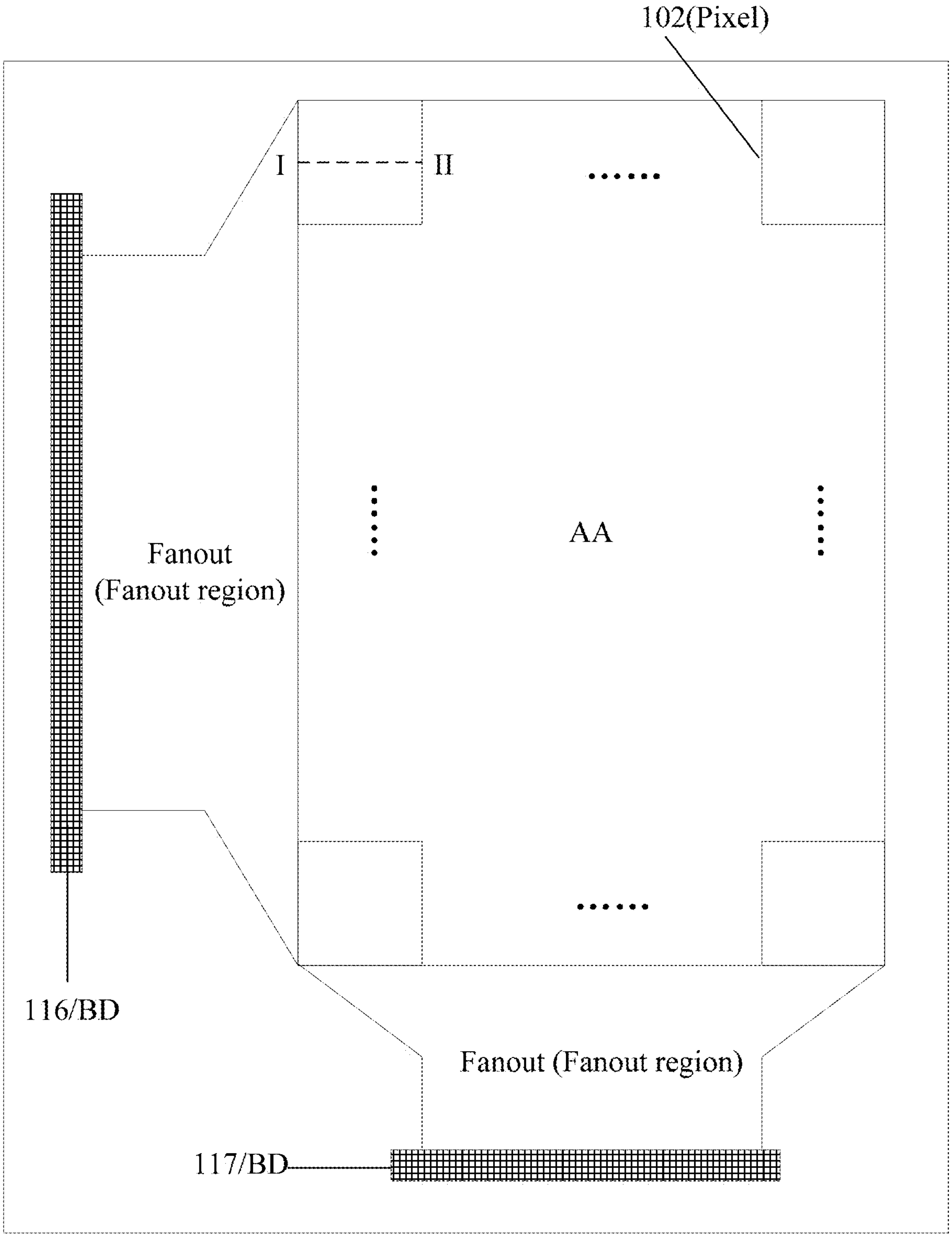
FIG. 2 is a schematic structural diagram of a pattern recognition substrate according to an embodiment of the disclosure.

Furthermore, a shielding layer (ITO) 115 has a block structure that completely covers each pixel region within the pixel region in the display region AA, and has a block structure that completely covers a bonding region within the bonding region BD shown in FIG. 2, to play the role of shielding external electromagnetic interference; and in order to ensure transmittance, the shielding layer (ITO) 115 is generally made of transparent material such as indium tin oxide. In some embodiments, the shielding layer 115 is connected to ground. Generally, as shown in FIG. 2, a gate driver chip (Gate IC) 116 and a source driver chip (Source IC) 117 are provided in the bonding region BD. During specific implementation, the gate drive chip (Gate IC) 116 provides a drive signal for a scan line G through a lead wire of a fanout region (Fanout), and the source drive chip (Source IC) 117 provides a drive signal for a read line (Test) through a lead wire of the fanout region (Fanout).

In some embodiments, in the above-mentioned pattern recognition substrate according to an embodiment of the disclosure, as shown in FIGS. 5 and 10, a planarization layer 108 is located between a layer where the transistor T is located and a layer where the first electrode 1021 is located, facilitating reception of the fingerprint-reflected light that is transmitted by the first electrode 1021 and not absorbed by the I-type semiconductor layer, so the planarization layer 108 can be multiplexed as the light-absorbing layer 103. Such arrangement can also avoid the light-absorbing layer 103 from being arranged separately, reduce the number of film layers, reduce the production cost, and improve the production efficiency. In some embodiments, in order to achieve better light absorption effect, a material of the planarization layer 108 may be black resin or the like.

Figure 25:
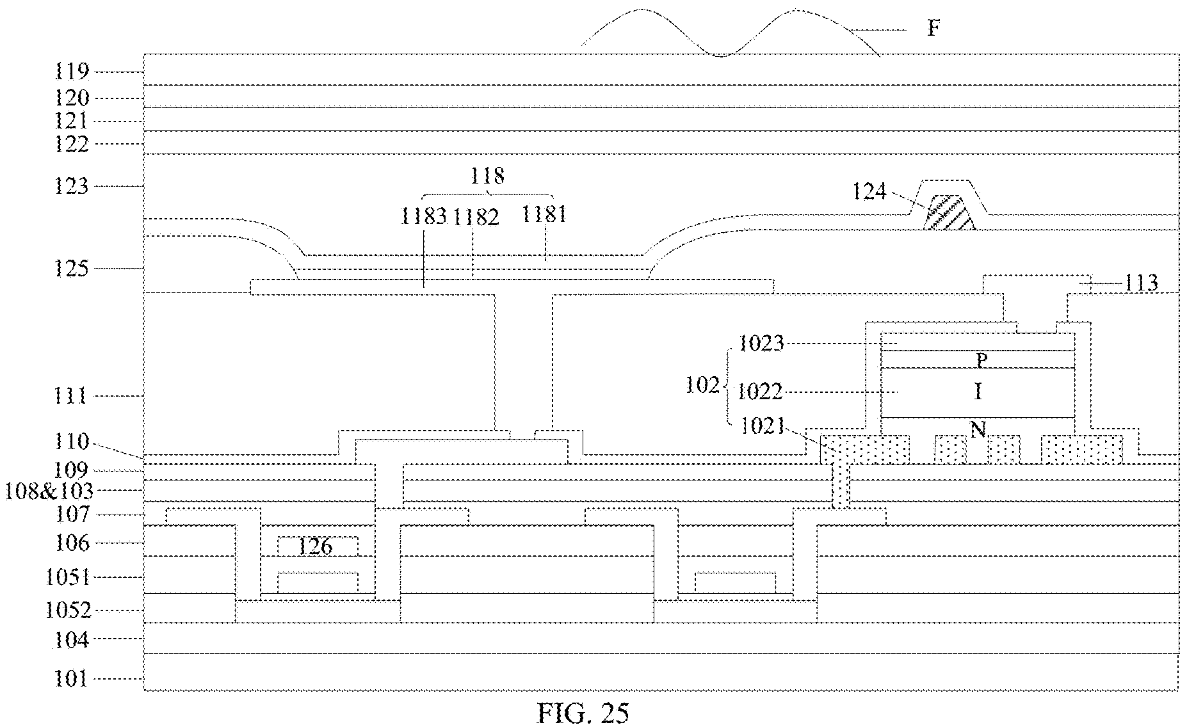
FIG. 25 is a schematic diagram of another cross-sectional structure along line I-II in FIG. 2.
Figure 26:
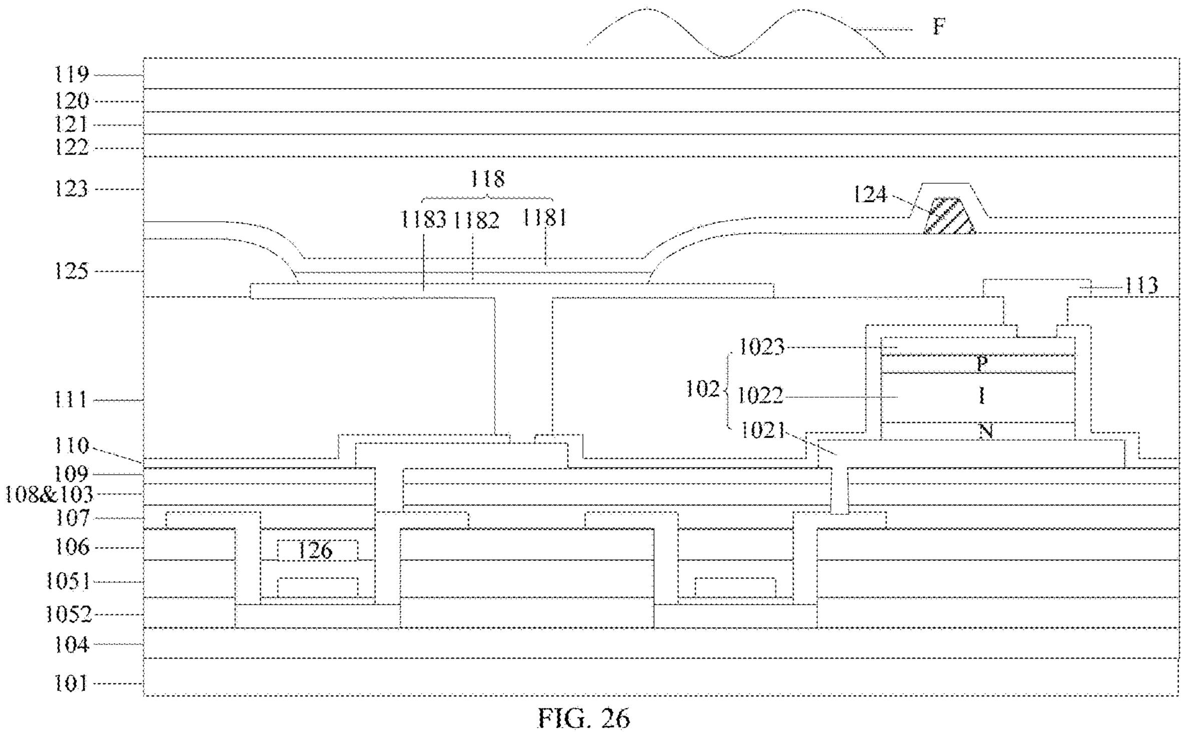
FIG. 26 is a schematic diagram of yet another cross-sectional structure along line I-II in FIG. 2.

The above content only describes the pattern recognition substrate having the fingerprint recognition function. In some embodiments, the pattern recognition substrate may also have a display function. The above pattern recognition substrate according to an embodiment of the disclosure, as shown in FIGS. 25 and 26, may further include: a light-emitting device 118 located on a side of the layer where the photosensitive device 102 is located away from the base substrate 101, realizing the display function through the light-emitting device 118 emitting light. Optionally, an orthographic projection of the light-emitting device 118 on the base substrate 101 does not overlap with an orthographic projection of the photosensitive device 102 on the base substrate 101, to avoid the light-emitting device 118 from blocking the light reflected by the finger.

When the pattern recognition substrate according to the disclosure has both the display function and touch function, as shown in FIGS. 25 and 26, the pattern recognition substrate may include a protective cover 119, an optical glue 120, a polarizer 121, a touch layer 122, an encapsulation layer 123, a cathode 1181, a support layer 124, a light emitting layer (EL) 1182, a pixel definition layer 125, an anode 1183 and a bias metal layer 113 arranged in the same layer, a resin layer 111, a protective layer 110, a second electrode 1023, a photoelectric conversion layer 1022, a first electrode 1021, a second insulating layer (PVX2) 109, a planarization layer (PLN) 108, a first insulating layer (PVX1) 107, a source and a drain of a transistor T, an interlayer dielectric layer (ILD) 106, a second gate metal layer 126, a first sub-gate insulating layer 1051, a gate of the transistor T, a second sub-gate insulating layer 1052, an active layer of the transistor T, a buffer layer (buffer) 104 and a base substrate 101 from top to bottom.

During fingerprint recognition, when the finger F touches the pattern recognition substrate, the light reflected by the finger passes through the gap between the light-emitting devices 118 and reaches the photoelectric conversion layer 1022 of the photosensitive device 102. The I-type semiconductor layer of the photoelectric conversion layer 1022 absorbs a part of the light reflected by the finger, detecting the intensity of the fingerprint-reflected light. Due to different energy of diffusely reflected light downwards at the valleys and ridges, the light intensities detected by the array of the photosensitive device 102 are different, thus obtaining the fingerprint image information. Also, the fingerprint-reflected light that is not absorbed by the I-type semiconductor layer passes through the light-transmitting region L of the first electrode 1021 and is absorbed by the light-absorbing layer 103, avoiding the fingerprint-reflected light that is not absorbed and converted by the I-type semiconductor layer from being reflected multiple times between the first electrode 1021 and the finger, and thus improving the accuracy of fingerprint recognition.

Based on the same inventive concept, the disclosure further provides a display device, including the above pattern recognition substrate according to embodiments of the disclosure. Since the principle of the display device to solve the problem is similar to the principle of the above pattern recognition substrate to solve the problem, implementations of the display device can refer to embodiments of the above pattern recognition substrate, and the repeated description thereof will be omitted.

In some embodiments, the above display device according to an embodiment of the disclosure may be: a mobile phone, a tablet computer, a television, a display, a notebook computer, a digital photo frame, a navigator, a smart watch, a fitness wristband, a personal digital assistant, and any other product or component with display function. The display device according to an embodiment of the disclosure may also include but not limited to: a radio frequency unit, a network module, an audio output unit, an input unit, a sensor, a display unit, a user input unit, an interface unit, a memory, a processor, and a power supply, etc. Those skilled in the art can understand that the composition of the above display device does not constitute a limitation on the display device, and the display device may include more or fewer components than the above components, or combine some components, or use different component arrangements.

Evidently, those skilled in the art can make various modifications and variations to embodiments of the disclosure without departing from the spirit and scope of embodiments of the disclosure. Thus, the disclosure is also intended to encompass these modifications and variations to embodiments of the disclosure as long as these modifications and variations come into the scope of the claims of the disclosure and their equivalents.

What is claimed is:

1. A pattern recognition substrate, comprising:

a base substrate;

a photosensitive device located on the base substrate, the photosensitive device comprising a first electrode, a photoelectric conversion layer and a second electrode that are stacked, wherein the photoelectric conversion layer comprises an I-type semiconductor layer with a thickness enough to convert a part of fingerprint-reflected light to an electrical signal, and the first electrode comprises a light-transmitting region transmitting fingerprint-reflected light that is not converted by the photoelectric conversion layer; and a light-absorbing layer located between the base substrate and a layer where the photosensitive device is located to absorb the fingerprint-reflected light that is not converted by the photoelectric conversion layer.

2. The pattern recognition substrate according to claim 1, wherein the first electrode is a metal electrode, the first electrode comprises a plurality of openings arranged in an array, and the plurality of openings is the light-transmitting region.

3. The pattern recognition substrate according to claim 2, wherein the openings are approximately circular.

4. The pattern recognition substrate according to claim 3, wherein an aperture ratio A of the first electrode satisfies a following relationship:

$$A=\pi*d^2/(4q^2);$$

wherein d is a diameter of a circle, and q is a distance between centers of two adjacent circles.

5. The pattern recognition substrate according to claim 2, wherein the openings are approximately square.

6. The pattern recognition substrate according to claim 5, wherein an aperture ratio A of the first electrode satisfies a following relationship:

$$A=d^2/q^2;$$

wherein d is a side length of a square, and q is a distance between centers of two adjacent squares.

7. The pattern recognition substrate according to claim 4, wherein 2 μm≤d≤6 μm, 5 μm≤q≤20 μm, and 0.1≤A≤0.6.

8. The pattern recognition substrate according to claim 2, wherein a center of each of the openings is located at a vertex of a polygon.

9. The pattern recognition substrate according to claim 8, wherein the polygon is a rectangle or a hexagon.

10. The pattern recognition substrate according to claim 1, wherein the first electrode is a transparent electrode, and an entire region of the first electrode is the light-transmitting region.

11. The pattern recognition substrate according to claim 1, further comprising a transistor located between the base substrate and the light-absorbing layer, wherein the transistor is electrically connected to the first electrode, and the transistor is a double-gate transistor.

12. The pattern recognition substrate according to claim 11, wherein an orthographic projection of the transistor on the base substrate does not overlap with an orthographic projection of the photosensitive device on the base substrate.

13. The pattern recognition substrate according to claim 11, further comprising a planarization layer located between a layer where the transistor is located and a layer where the first electrode is located, wherein the planarization layer is multiplexed as the light-absorbing layer.

14. The pattern recognition substrate according to claim 13, wherein a material of the planarization layer is black resin.

15. The pattern recognition substrate according to claim 1, wherein a thickness of the I-type semiconductor layer in a direction perpendicular to the base substrate is less than 9000 Å.

16. The pattern recognition substrate according to claim 1, further comprising: a light-emitting device located on a side of the layer where the photosensitive device is located away from the base substrate;

wherein an orthographic projection of the light-emitting device on the base substrate does not overlap with an orthographic projection of the photosensitive device on the base substrate.

17. A display device, comprising the pattern recognition substrate according to claim 1.

* * * * *